United States Patent
Girard et al.

(10) Patent No.: US 9,780,603 B2
(45) Date of Patent: Oct. 3, 2017

(54) METHOD, DEVICE AND SYSTEM FOR MANAGING A PROVISION OF ENERGY

(71) Applicant: GEMALTO SA, Meudon (FR)

(72) Inventors: Pierre Girard, La Ciotat (FR); HongQian Karen Lu, La Ciotat (FR)

(73) Assignee: GEMALTO SA, Meudon (FR)

( * ) Notice: Subject to any disclaimer, the term of this patent is extended or adjusted under 35 U.S.C. 154(b) by 50 days.

(21) Appl. No.: 14/387,506

(22) PCT Filed: Mar. 27, 2013

(86) PCT No.: PCT/EP2013/056622
§ 371 (c)(1),
(2) Date: Sep. 23, 2014

(87) PCT Pub. No.: WO2013/144256
PCT Pub. Date: Oct. 3, 2013

(65) Prior Publication Data
US 2015/0097698 A1  Apr. 9, 2015

(30) Foreign Application Priority Data
Mar. 28, 2012 (EP) .................................... 12305357

(51) Int. Cl.
*G08B 23/00* (2006.01)
*H02J 13/00* (2006.01)
(Continued)

(52) U.S. Cl.
CPC .............. *H02J 13/00* (2013.01); *G01R 21/00* (2013.01); *G06Q 10/06* (2013.01);
(Continued)

(58) Field of Classification Search
CPC ... G06Q 10/06; G06Q 10/06393; H02J 13/00; H02J 13/0017; H02J 3/008; H02J 3/14;
(Continued)

(56) References Cited

U.S. PATENT DOCUMENTS 5,764,155 A * 6/1998 Kertesz ............... H02J 13/0086
340/3.21
8,032,233 B2 * 10/2011 Forbes, Jr. .............. G01D 4/004
323/299

(Continued)

FOREIGN PATENT DOCUMENTS

EP  2 348 696 A1  7/2011
WO  WO 2012/004597 A2  1/2012

OTHER PUBLICATIONS

International Search Report (PCT/ISA/210) dated May 7, 2013, by the European Patent Office as the International Searching Authority for International Application No. PCT/EP2013/056622.

*Primary Examiner* — Firmin Backer
*Assistant Examiner* — Adnan Aziz
(74) *Attorney, Agent, or Firm* — Buchanan Ingersoll & Rooney PC (57) ABSTRACT

A remote server is connected to at least one energy box, each energy box being connected to at least one energy consuming device, and each energy box being connected to a metering device. The remote server sends to the energy box a transaction demand. The energy box sends to at least one energy consuming device an energy consumption reduction request. The metering device measures energy consumption of the energy consuming device. The metering device sends to the energy box the measured energy consumption. The energy box verifies whether the demanded transaction has been carried out based upon at least one test, the test depending on at least one measured energy consumption. If the demanded transaction has been carried out, the energy box sends to a remote server a transaction response.

10 Claims, 1 Drawing Sheet

(51) Int. Cl.
*G06Q 10/06* (2012.01)
*G01R 21/00* (2006.01)
*H02J 3/14* (2006.01)
*H02J 3/00* (2006.01)

(52) U.S. Cl.
CPC .......... *H02J 13/0017* (2013.01); *H02J 3/008* (2013.01); *H02J 3/14* (2013.01)

(58) Field of Classification Search
CPC .... H02J 2003/143; Y04S 20/34; Y04S 20/40; Y04S 20/222; Y04S 20/224; Y04S 20/322; Y04S 20/525; Y04S 40/12; Y04S 50/10; Y04S 50/14; Y02B 70/343; Y02B 70/346; Y02B 70/3225; Y02B 90/242; Y02B 90/245; Y02B 90/2607
USPC .............................. 340/870.02; 700/286, 295
See application file for complete search history.

(56) References Cited

U.S. PATENT DOCUMENTS

| | | | | |
|---|---|---|---|---|
| 8,185,250 B2* | 5/2012 | Sato | ...................... | G05B 13/024 700/295 |
| 8,204,633 B2* | 6/2012 | Harbin, III | .......... | F24D 19/1051 219/483 |
| 8,724,490 B2* | 5/2014 | Drake | ...................... | G06F 1/32 370/252 |
| 9,058,037 B2* | 6/2015 | Drake | ................. | A47L 15/0047 |
| 9,127,963 B2* | 9/2015 | Sfaelos | .................... | G01D 1/16 |
| 2003/0206542 A1 | 11/2003 | Holder | | |
| 2004/0095237 A1* | 5/2004 | Chen | .................... | F24F 11/0086 340/506 |
| 2004/0193329 A1* | 9/2004 | Ransom | ................. | H04L 63/20 700/286 |
| 2005/0065742 A1* | 3/2005 | Rodgers | ................. | G01D 4/004 702/62 |
| 2005/0138432 A1* | 6/2005 | Ransom | ................. | G01D 4/004 726/4 |
| 2005/0192713 A1* | 9/2005 | Weik | .................... | G06Q 50/188 700/295 |
| 2008/0136581 A1 | 6/2008 | Heilman et al. | | |
| 2009/0062970 A1 | 3/2009 | Forbes, Jr. et al. | | |
| 2009/0112758 A1* | 4/2009 | Herzig | .................... | G01D 4/004 705/40 |
| 2009/0135836 A1* | 5/2009 | Veillette | ................ | G01D 4/004 370/400 |
| 2009/0187499 A1* | 7/2009 | Mulder | .................. | G05B 15/02 705/30 |
| 2009/0240381 A1* | 9/2009 | Lane | ......................... | H02J 3/14 700/296 |
| 2010/0161148 A1* | 6/2010 | Forbes, Jr. | ............. | G01D 4/004 700/295 |
| 2011/0054710 A1* | 3/2011 | Imes | .................... | F24F 11/0086 700/286 |
| 2011/0119515 A1* | 5/2011 | Sadwick | ................ | G01D 4/002 713/340 |
| 2011/0172841 A1* | 7/2011 | Forbes, Jr. | ............. | G01D 4/004 700/292 |
| 2011/0218690 A1* | 9/2011 | O'Callaghan | .......... | G06Q 10/06 700/295 |
| 2011/0251807 A1* | 10/2011 | Rada | ........................ | G01D 4/00 702/61 |
| 2011/0267202 A1* | 11/2011 | Efthymiou | ............. | G01D 4/004 340/870.03 |
| 2011/0271352 A1* | 11/2011 | Kalogridis | ............... | G01D 4/02 726/26 |
| 2012/0239218 A1* | 9/2012 | Forbes, Jr. | ............. | G01D 4/004 700/295 |
| 2013/0197921 A1* | 8/2013 | Shudark | ................ | H02J 3/14 705/1.1 |

* cited by examiner

METHOD, DEVICE AND SYSTEM FOR MANAGING A PROVISION OF ENERGY

FIELD OF THE INVENTION

The invention relates generally to a method for managing a provision of energy.

Furthermore, the invention also pertains to a device for managing a provision of energy.

Finally, the invention also pertains to a system for managing a provision of energy.

STATE OF THE ART

It is known that, when there is an electricity consumption peak, an energy supplier requests a service provider to reduce an energy consumption. The energy is delivered, over an energy transport network or termed grid, to a consumer.

A remote server that is operated by the service provider is connected, via a data communication network, to a fleet of energy boxes.

The energy boxes are located within either factory premises or houses of people. Each energy box manages a switch-off of one or several electric heaters, pool pumps and/or an household electrical appliance(s), as energy consuming devices. The energy box is connected to the energy consuming devices.

The remote server transmits to one or several energy boxes a transaction demand, like a request for switching-off energy consumption that is managed by each solicited energy box.

The energy consumption is measured and transmitted to the service provider the day after a transmission of the transaction demand.

However, the service provider knows precisely the measured energy consumption at a client (or consumer) side.

There is a need to provide a solution that allows knowing whether the sent transaction demand has been or has not been taken into account at a client side while protecting a privacy of the client.

SUMMARY OF THE INVENTION

The invention proposes a solution for satisfying the just herein above specified need by providing a method for managing a provision of energy.

According to the invention, at least a first remote server being connected to at least one energy box, each energy box being connected to at least one energy consuming device, each energy box being connected to a metering device, the method comprises the following steps:

the first remote server sends to at least one energy box a transaction demand, as a first energy consumption reduction request;

the energy box sends to at least one energy consuming device at least one second energy consumption reduction request;

the metering device measures at least one energy consumption of the at least one energy consuming device;

the metering device sends to the energy box at least one measured energy consumption;

the energy box or a first device connected to the energy box verifies whether the demanded transaction has not been or has been carried out at least in part based upon at least one test, the at least one test depending on at least one measured energy consumption; and if the demanded transaction has been carried out at least in part, then the energy box or the first device sends to the first remote server or a second remote server a transaction response.

The principle of the invention is to:

receive, at a client side, from a remote server a transaction demand or request, request to one (or several) connected device(s) to reduce its(their) energy consumption, check whether the demanded transaction has been executed at least partly, and if so, send to the server (or another one) a transaction response.

It is noteworthy that a check consists in performing one (or several) test(s) thanks to one (or several) measurement(s) of energy consumption of one (or several) energy consuming device(s).

An energy box carries out the test(s) and, when the test(s) is(are) more or less conclusive, also informs the soliciting server (or another server) by transmitting this latter a corresponding transaction response.

A token, as device connected to the energy box, may carry out, instead of the energy box, the test(s) and, when the test(s) is(are) more or less conclusive, also informs the soliciting server (or another server) by transmitting it a corresponding transaction response.

Thus, a server receives the transaction response that corresponds to the sent transaction demand. The received transaction response is therefore associated with the demanded transaction. The received transaction response depends on the sent transaction demand and a result of the test(s) that is(are) carried out at the client side. The server becomes therefore aware that the sent transaction demand has been taken into account.

It is to be noted that no measured energy consumption is transmitted to the server.

The invention allows to ensure that a reduction of an energy consumption has occurred thanks to a reception of a transaction demand at a client side and to inform a server with a corresponding transaction response without disclosing any measured energy consumption at the client side.

According to a further aspect, the invention is a device for managing a provision of energy.

According to the invention, the device being connected to a first remote server, the device being connected to at least one energy consuming device, the device being connected to a metering device, the device is adapted to:

receive a transaction demand, as a first energy consumption reduction request;

send to at least one energy consuming device at least one second energy consumption reduction request;

receive at least one measured energy consumption;

verify whether the demanded transaction has not been or has been carried out at least in part based upon at least one test, the at least one test depending on at least one measured energy consumption; and send, if the demanded transaction has been carried out at least in part, to the first remote server or a second remote server a transaction response.

As device, it may be an energy box or a token.

Within the present description, an energy box is a computer device that is intended to communicate with the outside world.

According still to a further aspect, the invention is a system for managing a provision of energy.

According to the invention, the system comprises at least one first remote server, at least one energy box, at least one energy consuming device and at least one metering device, each energy box being connected to the first remote server, each energy box being connected to at least one energy consuming device, each energy box being connected to a metering device. The first remote server is adapted to send to at least one energy box a transaction demand, as a first energy consumption reduction request. The metering device is adapted to:

measure at least one energy consumption of the at least one energy consuming device;

send to the energy box at least one measured energy consumption.

And the energy box is adapted to send to at least one energy consuming device at least one second energy consumption reduction request. The energy box or a first device connected to the energy box is adapted to verify whether the demanded transaction has not been or has been carried out at least in part based upon at least one test, the at least one test depending on at least one measured energy consumption; and send, if the demanded transaction has been carried out at least in part, to the first remote server or a second remote server a transaction response.

As token, it may be a Universal Serial Bus (or USB) type dongle, a smart card, as removable token, to be coupled to an energy box or a chip intended to be fixed, possibly in a removable manner, to an energy box, as hosting device.

BRIEF DESCRIPTION OF THE DRAWINGS

Additional features and advantages of the invention will be more clearly understandable after reading a detailed description of one preferred embodiment of the invention, given as an indicative and non-limitative example, in conjunction with the following drawings.

DETAILED DESCRIPTION

Herein under is considered a case in which the invention method for managing a provision of energy is implemented by, among others, at a client side, a USB type dongle, as removable token and device for managing a provision of energy, that is coupled to an energy box.

However, according to another implementation (not represented), an energy box is a standalone entity and constitutes a device for managing a provision of energy that carries out functions that are carried out by the token and that are described infra.

Within the present description, a token is a smart object that is intended to communicate with the outside world.

Naturally, the herein below described embodiment is only for exemplifying purposes and is not considered to reduce the scope of the invention.

For example, instead of being a USB type dongle, the token may be a smart card or any other electronic medium that may have different form factors while including a chip.

According to another example, the token may also be a chip soldered, possibly in a removable manner, to an energy box, as hosting device.

Figure 1:
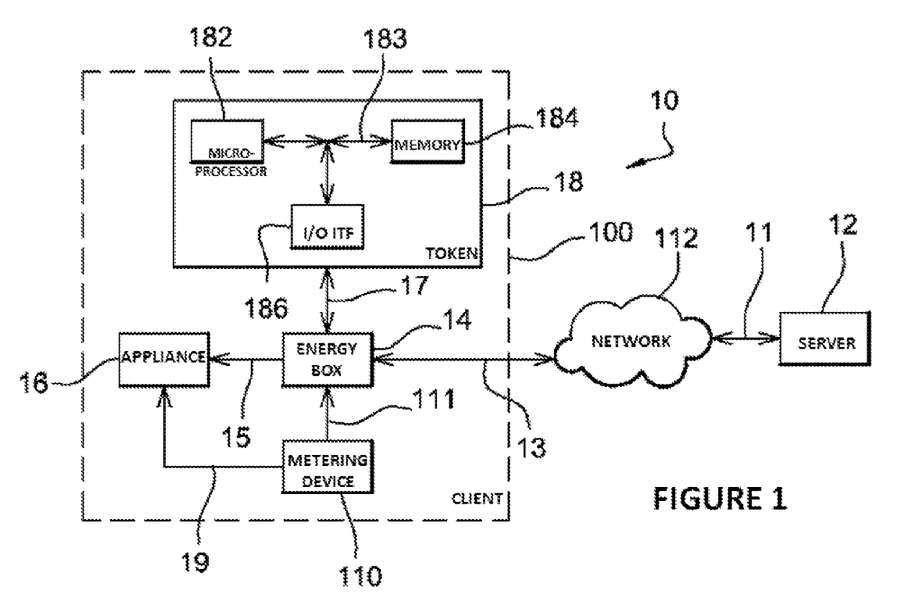
FIG. 1 illustrates a simplified diagram of one embodiment of a system for managing a provision of energy, by using notably one remote server, an energy box connected to both the server and one energy consuming device whose energy consumption is surveyed by a metering device and undergoes one test(s) to be satisfied at a client side, according to the invention.

FIG. 1 shows schematically a system 10 for managing a provision of energy.

Such a system 10 includes a central remote server 12 and, at a client 100 side, an energy box 14, one household appliance 16, as energy consuming device, a USB type dongle 18, as removable token and first device, and a metering device 110.

The household appliance 16 may include a pool pump, a heater, a washing machine, a tumble-dryer, a dish washer or other device that needs electricity, as energy, to work.

For sake of simplicity, the energy box 14, the energy consuming device 16, the USB type dongle 18 are termed hereinafter the box 14, the consuming device 16 and the token 18.

As to energy, it may be, among others, electricity, gas and/or any other fluid, like water, that allows a consuming device to operate.

A client 100 user may have subscribed a service for managing a provision of energy. A corresponding client 100 system may be located in an individual's house or a factory.

It is to be noted that only one client 100 system is represented for clarity reason. However, the server 12 controls a plurality (or fleet) of client systems preferably via their corresponding associated tokens.

Only one household appliance 16 is represented for clarity reason. However, the box 14 may be connected to several consuming devices under the control of the box 14 or the token 18.

The server 12 is connected, through a bi-directional cable link 11, to one (or several) data communication network(s) 112, such as an Internet network.

The server 12 may be included within an OTA (acronym for "Over The Air") and/or an OTI (for "Over The Internet") platform(s).

The box 14 is connected to the data communication network 112.

The server 12 plays preferably a role of a manager of tokens, as devices for managing a provision of energy. The server 12 manages the tokens coupled to boxes.

According to such a preferred embodiment, each box 14 is controlled by the token 18.

Alternately, the server 12 manages a fleet of boxes, as devices for managing a provision of energy. According to such an embodiment, the boxes carry out functions that are carried out by the associated tokens.

The server 12, as first server, is a computer and includes a microprocessor (not represented), as data processing means.

The server 12 supports an application that, when running, allows providing a service for managing a provision of energy. Such a service for managing a provision of energy may be implemented, so as to decrease an energy consumption at the client 100 side. The service is executed, for instance, during a consumption load peak or for a delay of an activity. The delay of an activity allows moving or shifting a consumption load away from a consumption load peak.

The server 12 includes or accesses a memory (not represented), as server memory.

The server memory registers one or several addresses, as identifiers of its interlocutors, be it either tokens or boxes.

According to one preferred embodiment, the server memory registers data relating to each token that is coupled to a box of a fleet.

Alternatively, the server memory stores data relating to a plurality (or fleet) of boxes.

The server memory may register at least one key to be used for encrypting and/or decrypting data for each token 18 managed by the server 12. Thus, the server 12 (and its interlocutor) is able to protect data to be exchanged with either a token 18 or a box 14, as server interlocutor. The key may be a public key related to either the token 18 or the box 14, as server interlocutor.

The server 12 is able to transmit a transaction demand, as a first energy consumption reduction request.

The transaction demand may be an order or request for switching off, i.e. stopping, at least in a temporary manner, a provision of energy to one or several consuming devices or an order or request for reducing, at least in a temporary manner, energy provided to one or several consuming devices.

The server 12 (more exactly the server memory) stores preferably at least one key Ks shared with either a token 18 or a box 14, as server interlocutor.

Optionally, prior to a sending of the transaction demand from the server 12 to each token 18 as its interlocutor, the server 12 is arranged to sign the transaction demand. Such a signature allows authenticating (or proving that) a sender of the transaction demand, namely the server 12. To sign the transaction demand, the server 12 uses a predetermined signature algorithm, like a Rivest Shamir Adleman (or RSA) algorithm, and a predetermined signature key that are both stored within the server memory. The signature key is preferably related to the server 12, as private key. The interlocutor, either the token 18 or the box 14, verifies a corresponding signed transaction demand by using a predetermined signature verification algorithm and a predetermined signature verification key that are both stored within the server interlocutor memory. The signature verification key is preferably a public key relating to the server 12 that has been deduced from the server private key. According to one particular embodiment, the signature algorithm and the signature verification algorithm are one and the same algorithm, like a Message Authentication Code (or MAC) algorithm and the signature key and the signature verification key constitute one and the same key, as a symmetric key and a key shared between the server 12 and its interlocutors, namely a fleet of tokens or boxes. According to another embodiment, the signature key and the signature verification key are one and the same specific symmetric key while being different for each token or box. Thus, if one specific symmetric key is fraudulently used, then the use of the specific symmetric key does only concern one server interlocutor (and not all the server interlocutors).

According to an important feature of the invention, the server 12 is able to receive a transaction response associated with a sent transaction demand that has been sent by the server 12.

The server 12 may be able to delegate to another server (not represented) a reception of a transaction response.

The transaction response is preferably received if the demanded transaction has been completed or carried out at least in part at a client 100 side.

The transaction response may be received irrespective of whether the demanded transaction has been or has not been carried out at a client 100 side. In other words, the server 12 receives a transaction response not only when the demanded transaction demand has been carried out at least in part but also when the demanded transaction demand has not been carried out at all.

The transaction response may include a status a corresponding value of which is predetermined and shared between a sender of the transaction response and the server 12 that has to interpret the transaction response. Such a transaction response status allows determining whether the demanded transaction has not been or has been carried out at least in part at the client 100 side, i.e. by the token 18 and/or the box 14.

The transaction response may include information that indicates a completion level, i.e. how much the demanded transaction has been carried out at least in part at the client 100 side.

The transaction response does not include any information relating to a measured energy consumption.

Thanks to a received transaction response, the server 12 may become aware of either a partial or total completion or no-completion of the demanded transaction at a client 100 side.

The transaction response may include a result of one or several tests that have been carried out by the token 18 or the box 14.

The result with respect to the demanded transaction is thus known to the server 12, as addressee of the transaction response, due to a data value relating to the transaction response corresponding to the sent transaction demand.

The box 14 is connected, over a wire or wireless link 13, to the data communication network 112.

When wireless, the link 13 may relate to a long range Radio-Frequency (or RF) link(s). The RF link(s) may be fixed at several hundreds of MHz, for instance, around 850, 900, 1800, 1900 MHz, 2 GHz or more.

Such a link 13, be it wire or wireless, enables to exchange data in two ways between the box 14 and the data communication network 112.

The box 14 is preferably an intermediary entity, i.e. plays a role of a relay, between the server 12 and the token 18, so as to receive by the token 18 a transaction demand, complete (or not) at least in part by the token 18 a demanded transaction and send from the token 18 a corresponding transaction response, when applicable.

The box 14 acts as a modulator-demodulator (or modem), i.e. that carries out the two following operations:

a modulation of an analogical carrier signal to encode digital information, as transaction response, to be transmitted, possibly over an antenna (not represented), to the server 12 (or another server), and a demodulation of a received analogical carrier signal to decode encoded digital information, as transaction demand, that is received, possibly over an antenna (not represented), from the server 12.

The box 14 may be an intermediary entity between, on one hand, the consuming device 16 and/or the metering device 110, and, on the other hand, the token 18.

Alternately, instead of two separated entities, the box and the metering device constitute one and the same entity.

The box 14 is connected to the household appliance 16, as single consuming device.

The box 14 is connected to the metering device 110.

The box 14 includes a microprocessor (not represented), as means for processing data, at least one memory (not represented) for storing data and at least one input/output (or I/O) interface (not represented) for exchanging data with the outside of the box 14.

The box 14 microprocessor (instead of a token 18 microprocessor) may allow to interpret a first energy consumption reduction request, as a command originating from outside of the box 14, and to send to at least one consuming device 16 a second energy consumption reduction request, as a result of an interpretation of the received command.

The box 14 is able to communicate with the connected consuming device 16 while using a predetermined communication protocol.

The box 14 is able, preferably under a token 18 control, to command the consuming device 16 to shut off or reduce its energy consumption depending on the first consumption reduction request issued from the server 12.

The box 14 includes an I/O interface which uses, for instance, a USB type protocol for exchanging data with the token 18.

The box 14 includes an I/O interface that uses, for instance, a Serial Peripheral Interface (or SPI) type protocol for exchanging data with the metering device 110.

The metering device 110 is connected to an energy distribution network (not represented).

The metering device 110 measures an energy consumption of the whole house or factory, i.e. an energy consumption of all the consuming devices included within the house or factory.

According to another embodiment, the metering device is connected to each consuming device to be controlled in energy consumption. According to such an embodiment, the metering device is connected, through at least a mono-directional link, to the consuming device. Such a link may be wire or contact-less. This link may be bi-directional. Thus, the metering device is able to retrieve information issued from a particular consuming device amongst all the consuming devices.

The metering device 110 includes a microprocessor (not represented), as means for processing data, at least one memory (not represented) for storing data and at least one I/O interface (not represented) for exchanging data with the outside of the box 14.

The metering device 110 measures, preferably in a periodic manner, an energy consumption of the set of the consuming device(s) 16 managed at the client 100 side.

The metering device 110 (more exactly the metering device memory) stores preferably at least one key shared with either the token 18 or the box 14, as metering device interlocutor.

The metering device 110 stores preferably an integrity algorithm to be used to apply to data before its sending. Data resulting from such an integrity operation allows its addressee to verify that data has not been modified.

The metering device 110 stores each measured energy consumption.

The metering device 110 is connected, through a bi-directional wire or contact-less link 111, to the box 14.

The metering device 110 is able to send to the box 14 one or several measured energy consumptions. The metering device 110 sends preferably to the box 14 each measured consumption just after a corresponding measurement.

Optionally, prior to a sending of a measured energy consumption from the metering device 110 to the box 14, the metering device 110 is arranged to sign the measured energy consumption. Such a signature allows authenticating the metering device 110 as sender of the measured energy consumption. To sign the measured energy consumption, the metering device 110 uses a predetermined signature algorithm and a predetermined signature key that are both stored within the metering device memory. The signature key is preferably related to the metering device 110, as private key. The interlocutor, either the token 18 or the box 14, verifies a corresponding signed transaction demand by using a predetermined signature verification algorithm and a predetermined signature verification key that are both stored within a metering device interlocutor memory. The signature verification key is preferably a public key relating to the metering device 110 that has been generated from the metering device private key.

Optionally, prior to a sending of a measured energy consumption from the metering device 110 to the box 14, the metering device 110 is arranged to apply to the measured energy consumption an integrity algorithm to be used to protect the measured energy consumption in its integrity. Thus, either the token 18 or the box 14, as the metering device interlocutor, is able to detect whether the received measured energy consumption has or has not been modified.

According to another embodiment, instead of the metering device 110, a second device (not represented), like another token that is coupled or connected to the metering device 110, is arranged to sign a measured energy consumption to be sent and/or to apply to a measured energy consumption to be sent an integrity algorithm.

The token 18 is coupled to the box 14, as hosting device.

The token 18 is connected, through a bi-directional contact link 17, to the box 14.

According to another embodiment (not represented), the token 18 is connected, through a contact-less link, i.e. a short range RF link, to the box 14. Such a short range RF link is used for exchanging between the box 14 and the token 18 data at a short range distance typically from around 20 em (such as with a Near Field Communication (or NFC) type technology) until around 800 m (such as with a Bluetooth type technology). The RF link may be fixed, for instance, at 13.56 MHz for NFC with a range up to around 20 em, at 2.4-2.5 GHz with a range of about 10 m to about 100 m (for Zigbee (e.g. IEEE 802.15.4), Wifi and Bluetooth or Bluetooth low energy (e.g. IEEE 802.15.1)), from around 2.4 GHz to around 10 GHz (for Ultra Wide Band or UWB e.g. IEEE 802.15.4a).

The token 18 includes a chip (not represented). The chip includes at least one microprocessor 182, as data processing means, at least one memory 184 and at least one I/O interface 186 that are internally all connected, through an internal bidirectional data bus 183, to each other.

The token I/O interfaces 186 allow communicating data from the internal chip components to the chip exterior and conversely.

The token microprocessor 182 processes, controls and communicates internally data, with all the other components incorporated within the chip and, through the I/O interfaces 186, with the chip exterior.

The token microprocessor 182 executes or runs one (or several) application(s). The application(s) is(are) stored within the token memory 184.

As application, there is at least one application for managing a provision of energy.

The token microprocessor 182 is preferably able to initiate actions, in order to interact directly with the outside world, in an independent manner of the box 14. Such a capacity of interaction at the initiative of the token 18 is also known as proactive capacity. The token 18 is thus able to send, at its own initiative, through the box 14, to any device connected to the box 14, for instance, a proactive command for sending either a command, like a second energy consumption reduction request, to the consuming device 16, or information, like a transaction response, to the server 12.

The token microprocessor 182 executes preferably security functions.

The token microprocessor 182 may allow to interpret a first energy consumption reduction request, as a command originating from outside of the token 18, and to send to at least one consuming device 16 a second energy consumption reduction request, as a result of an interpretation of the received command. According to such an embodiment, the token 18 sends, through the box 14, to the connected consuming device 16, either an order (or request) for switching off a provision of energy or an order for reducing a provision of energy, as second energy consumption reduction request.

The token 18 is preferably adapted to receive a transaction demand and one or several measured energy consumptions.

The token 18 is preferably arranged to carry out one or several predetermined tests. Each test depends on one or several measured energy consumptions to be received.

According to an important feature of the invention, the token 18 is able to verify whether a demanded transaction to be received has not been or has been carried out at in least in part based upon one or several tests.

The token 18 is further adapted to send to an identified server a corresponding transaction response if the demanded transaction does satisfy the tests.

The token memory 184 may store data relating to a Uniform Resource Identifier (or URI), a Uniform Resource Locator (or URL) and/or an Internet Protocol (or IP) address of a first (remote) server from which a transaction demand is to be received.

The token memory 184 may store data relating to a URI, a URL and/or an IP address of a second server (not represented) to which a corresponding transaction response is to be transmitted.

The first server and the second server constitute preferably one and the same server 12.

Alternately, the first server and the second server are two separated servers.

The token 18 may be able to manage a white/black server list, as server(s) which is(are) authorized/forbidden to be an interlocutor(s) for getting data from it(them).

The token memory 184 may store credentials of a token user.

The credentials may include a subscriber identifier(s), like an International Mobile Subscriber Identifier (or IMSI), and one or several keys, like ki, allowing to identify and authenticate a subscriber to one or several radio communication network(s). The credentials are used for authenticating the token user to a concerned external entity(ies) which allow(s) updating a content of the token memory 184.

The credentials may comprise an identifier and/or a password. The token 18 may be arranged to submit automatically the credentials to a suitable server(s), so as to allow accessing a service managed by the server(s) which manage(s) a transaction demand to be sent and/or a corresponding transaction response to be received.

The token memory 184 may store at least one key to be used for encrypting and/or decrypting data, in order to protect data to be exchanged, in a confidential manner, with an external entity, like the server 12, as token interlocutor.

The token memory 184 stores preferably at least one key Ks shared with the server 12.

The security functions include preferentially an encryption/decryption process to be used before sending data to outside/after receiving data from outside, so as to protect access to data managed by the token 18. To encrypt data to be sent, the token 18 uses an encryption key and an encryption algorithm, such as an Advanced Encryption Standard (or AES), a Data Encryption Standard (or DES) or the like, that are stored within the token memory 184. To decrypt data to be received, the token 18 may use a decryption key and a decryption algorithm, such as an AES, a DES or the like, that are stored within the chip memory 164.

The security functions include preferentially a data signature process to be used before sending data, like a transaction response, to outside, so as to prove an origin of data originating from the token 18. To sign data, the token 18 uses a predetermined signature algorithm and a predetermined signature key that are both stored within the token memory 184. The signature key is preferably related to the token 18, as private key. The interlocutor, namely the server 12 or the consuming device 16, verifies a corresponding signed transaction response by using a predetermined signature verification algorithm and a predetermined signature verification key that are both stored within the interlocutor memory. The signature verification key is preferably a public key relating to the token 18 that has been deduced from the token private key. According to one embodiment, the signature key and the signature verification key constitute one and the same key, as a key shared between the token 18 and its interlocutor(s), namely the server 12 and possibly the consuming device 16.

The security functions include preferably an integrity control process to be used to data after its reception, so as to detect whether received data is or is not modified.

The security functions include preferably an integrity application process to be used to data before its sending, so as to allow a corresponding addressee to detect whether sent data is or is not modified.

Figure 2:
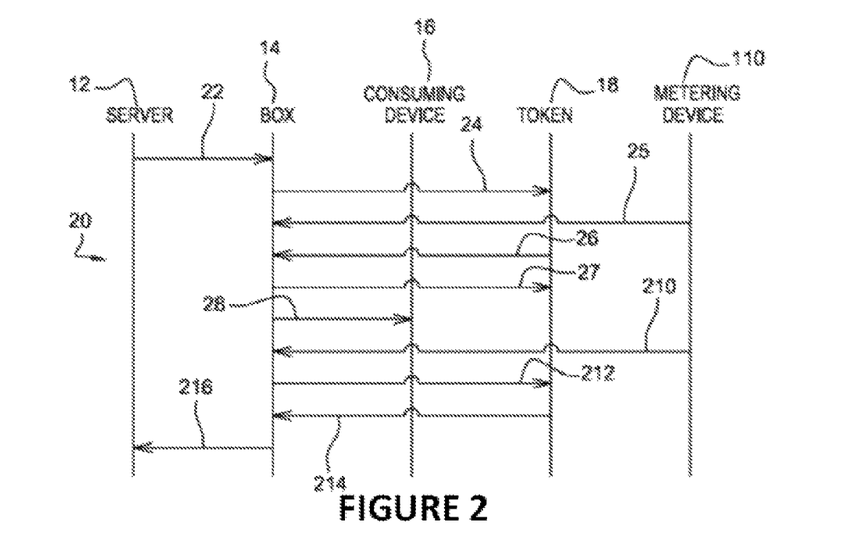
FIG. 2 represents an example of one message flow between notably the server, as issuer of a transaction demand, the energy box, the energy consuming device, the metering device of FIG. 1, so as to generate, when the test(s) is(are) satisfied, a corresponding transaction response and deliver it to the server.

FIG. 2 depicts an exemplary embodiment of the invention method 20 for managing a provision of energy that involves the server 12, the box 14, the consuming device 16, the token 18 and the metering device 110.

It is assumed that the token 18 controls the box 14, at least for any security function, like a data decryption, a data integrity control, a data signature or a data encryption, to be carried out each time the box 14 has received data from outside or has to send data to outside.

Optionally, the token 18 sends, through the box 14, to the server 12 a maximum load shifting capacity (not represented). Thus, the server 12 is able to define a first energy consumption request, as transaction demand, in a specific manner, while taking into account the maximum load shifting capacity.

The server 12 sends to the box 14 a transaction demand 22, as first energy consumption request. The transaction demand may be expressed in kilowatt (or KW).

Prior to a sending of the transaction demand, the server 12 may generate a signed transaction demand and send to the box 14 the signed transaction demand.

The box 14 sends to the token 18 the received transaction demand 24.

If the received transaction demand is signed, then the token 18 verifies that its sender is the server 12. If the sender is or is not the server 12, then the token 18 authorizes or forbids to reduce respectively an energy consumption with respect to a transaction demand.

It is assumed that the metering device 110 has been activated and there is only one consuming device 16 that operates and is surveyed according to the embodiment described in relation with FIG. 1.

The metering device 110 measures, in a periodic manner, like every minute, an energy consumption of all the consuming devices included within the house or factory, i.e. the consuming device 16, as the sole consuming device at the client 100 side. The metering device 110 stores a measured energy consumption, as total energy consumed at the client side.

Prior to a sending of a second energy consumption reduction request, the metering device 110 sends to the box 14, as soon as a first measurement is carried out, a measured energy consumption 25, as measured first energy consumption.

The token 18 may determine how many consuming devices and which one(s) the token 18 has to control so as to reduce an energy consumption while keeping up with the transaction demand. The token 18 may store a list of consuming device(s), possibly according to a priority order, that a corresponding user authorizes to switch off or power in a reduce manner.

It is assumed that only one consuming device 16 is working and is to be controlled, so as to satisfy the transaction demand. It means that either the consuming device 16 is to be shut off or its energy consumption is to be reduced.

The token 18 generates, for instance, a request for stopping, at least in a temporary manner, like a few hours, a provision of energy consuming device, as a corresponding second energy consumption reduction request.

The second energy consumption reduction request is different, in its form, from the first energy consumption reduction request.

Alternatively, the token 18 generates a request for reducing, such as a cut of a few kW, at least in a temporary manner, like a few hours, a provision of energy consuming device, as a corresponding second energy consumption reduction request.

The token 18 sends to the box 14 the second energy consumption reduction request 26.

The box 14 transmits to the token 18 the measured first energy consumption 27.

The box 14 sends to the consuming device 16, as third energy consumption reduction request, a command 28 for reducing an energy consumption.

The third energy consumption reduction request may be different, in its form, from the second energy consumption reduction request and the first energy consumption reduction request.

The third energy consumption reduction request may be identical to the second energy consumption reduction request.

The consuming device 16 shuts off.

Alternately, depending on the second energy consumption reduction request, the consuming device 16 decreases its energy consumption while working when the consuming device 16 supports such a function.

After a sending of the second energy consumption reduction request 26, the metering device 110 sends to the box 14, as soon as a second measurement is carried out, a measured energy consumption 210, as measured second energy consumption.

The box 14 sends to the token 18 the measured second energy consumption 212.

The token 18 carries out one or several tests.

Alternatively, the box 14 carries out one or several tests. According to such an alternative, the box 14 does not have to transmit to the token 18 any measured energy consumption.

The test(s) allow(s) determining, once a transaction demand has been received, whether an energy consumption has or has not been reduced.

The token 18 then verifies whether the demanded transaction has not been or has been carried out at least in part at the client 100 side while analysing whether the test(s) is(are) or is(are) not satisfied.

As test, the token 18 may compare the measured second energy consumption and the measured first energy consumption.

If the measured second energy consumption is less than the measured first energy consumption, then the token 18 sends to the server 12 a corresponding transaction response 214.

Prior to a sending of the transaction response, the token 18 may generate a signed transaction response and send to the server 12 the signed transaction response.

As test, the token 18 may compare a predetermined first threshold with an arithmetic difference between the measured second energy consumption and the measured first energy consumption.

If the arithmetic difference is greater than or equal to the first threshold, then the token 18 sends to the server 12 a corresponding first transaction response.

The transaction response may include data representative of a result of at least one test.

The transaction response is associated with the transaction demand.

The transaction response does not indicate any energy consumption at the concerned client 100 system. At the most, the server 12 knows that the energy consumption at the client side has been reduced in a manner more or less compliant with the transaction demand. In such a case, the privacy of the user or consumer is respected and the server 12 is not able to know which consuming device 16 has reduced possibly its energy consumption and what kind of consuming device has been involved so as to reduce an energy consumption at the concerned client 100 system.

Based upon the received transaction response, the box 14 transmits to the server 12 a corresponding transaction response 216.

The box 14 and the server 12 exchange data by using a HyperText Transfer Protocol (or HTTP) type protocol. The box 14 and the server 12 may use any other data exchange protocol allowing to exchange data.

If the received transaction response is signed, then the server 12 verifies whether its sender is the token 18. If the sender is or is not the token 18, then the server 12 authorizes or forbids to recognize respectively that an energy consumption with respect to a transaction demand has been taken into account. If the server 12 authorizes to recognize that an energy consumption has been decreased, then the server 12 sends to a user of the client 100 system a payment request. The server 12 may not know a breakdown of the energy consumption of the consuming device(s) thus protecting the privacy of the user.

The embodiment that has just been described is not intended to limit the scope of the concerned invention. Other embodiments may be given. As another embodiment example, instead of exchanging only with the server 12, the box 14 receives a transaction demand originating from the server 12 and sends to another server (not represented) a corresponding transaction response still originating from the token 18.

The invention claimed is:
1. A method for managing a provision of energy,
  wherein, at least a first remote server is connected to at least one energy box, each energy box being connected to at least one energy consuming device, and each energy box being connected to a metering device, the method comprising the following steps:

the first remote server sends to at least one energy box a transaction demand, as a first energy consumption reduction request;

the energy box sends to at least one energy consuming device at least one second energy consumption reduction request;

the metering device measures at least one energy consumption of the at least one energy consuming device;

the metering device sends to the energy box at least one measured energy consumption;

the energy box or a first device connected to the energy box verifies whether the demanded transaction has not been or has been carried out at least in part based upon at least one test, the at least one test depending on at least one measured energy consumption; and if the demanded transaction has been carried out at least in part, then the energy box or the first device generates and sends to the first remote server or a second remote server a signed transaction response, wherein the transaction response does not disclose measured energy consumption information and wherein the signed transaction response proves an origin of the transaction response.

2. The method according to claim 1, wherein the at least one test comprises a comparison between a measured second energy consumption and a measured first energy consumption, the first energy consumption being measured prior to a sending of the at least one second energy consumption reduction request, the second energy consumption being measured after a sending of the at least one second energy consumption reduction request, and if the measured second energy consumption is less than the measured first energy consumption, then the energy box or the first device sends to the first remote server or the second remote server a transaction response.

3. The method according to claim 1, wherein the at least one test comprises a comparison between a measured second energy consumption and a measured first energy consumption, the first energy consumption being measured prior to a sending of the at least one second energy consumption reduction request, the second energy consumption being measured after a sending of the at least one second energy consumption reduction request, and if the measured second energy consumption is less than the measured first energy consumption, then the energy box or the first device generates a signed transaction response, and the energy box or the first device sends to the first remote server or the second remote server the signed transaction response.

4. The method according to claim 1, wherein, the at least one test comprising a comparison between at least one predetermined first threshold and an arithmetic difference between a measured second energy consumption and a measured first energy consumption, the first energy consumption being measured prior to a sending of the at least one second energy consumption reduction request, the second energy consumption being measured after a sending of the at least one second energy consumption reduction request, and if the arithmetic difference is greater than or equal to the first threshold, then the energy box or the first device sends to the first remote server or the second remote server a first transaction response.

5. The method according to claim 1, wherein the metering device signs at least one measured energy consumption and the metering device sends to the energy box at least one signed measured energy consumption.

6. The method according to claim 1, wherein, the metering device is connected to a second device, the second device signs at least one measured energy consumption and the second device sends to the metering device at least one signed measured energy consumption.

7. The method according to claim 1, wherein, prior to a sending of at least one measured energy consumption from the metering device to the energy box, the metering device applies to the at least one measured energy consumption an integrity algorithm, and the energy box or the first device verifies the integrity of the at least one measured energy consumption.

8. The method according to claim 1, wherein, prior to a sending of the transaction demand from the first remote server to the at least one energy box, the method further includes a step in which the energy box or the first device sends to the first remote server a maximum load shifting capacity.

9. A device for managing a provision of energy, wherein, the device is connected to a first remote server, the device being connected to at least one energy consuming device, the device being connected to a metering device, and wherein the device is configured to:

receive a transaction demand, as a first energy consumption reduction request;

send to at least one energy consuming device at least one second energy consumption reduction request;

receive at least one measured energy consumption;

verify whether the demanded transaction has not been or has been carried out at least in part based upon at least one test, the at least one test depending on at least one measured energy consumption; and generate and send, if the demanded transaction has been carried out at least in part, to the first remote server or a second remote server a signed transaction response, wherein the transaction response does not disclose measured energy consumption information and wherein the signed transaction response proves an origin of the transaction response.

10. A system for managing a provision of energy, wherein the system comprises at least one first remote server, at least one energy box, at least one energy consuming device and at least one metering device, each energy box being connected to the first remote server, each energy box being connected to at least one energy consuming device, each energy box being connected to a metering device, wherein the first remote server is configured to send to at least one energy box a transaction demand, as a first energy consumption reduction request;

wherein the metering device is configured to:

measure at least one energy consumption of the at least one energy consuming device;

send to the energy box at least one measured energy consumption; and wherein the energy box is configured to:

send to at least one energy consuming device at least one second energy consumption reduction request;

and wherein the energy box or a first device connected to the energy box is configured to:

verify whether the demanded transaction has not been or has been carried out at least in part based upon at least one test, the at least one test depending on at least one measured energy consumption; and generate and send, if the demanded transaction has been carried out at least in part, to the first remote server or a second remote server a signed transaction response, wherein the transaction response does not disclose measured energy consumption information and wherein the signed transaction response proves an origin of the transaction response.

* * * * *